(12) United States Patent
Hori

(10) Patent No.: US 7,308,552 B2
(45) Date of Patent: Dec. 11, 2007

(54) MICROCONTROLLER

(75) Inventor: Yasuyuki Hori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 134 days.

(21) Appl. No.: 10/776,254

(22) Filed: Feb. 12, 2004

(65) Prior Publication Data
US 2004/0268023 A1    Dec. 30, 2004

(30) Foreign Application Priority Data
Jun. 30, 2003    (JP) .............................. 2003-186518

(51) Int. Cl.
*G06F 12/06*    (2006.01)
(52) U.S. Cl. ...................... 711/211; 711/103
(58) Field of Classification Search ................ 711/103, 711/211; 713/1
See application file for complete search history.

(56) References Cited

U.S. PATENT DOCUMENTS 5,390,317 A * 2/1995 Weiss et al. ................. 711/103
5,784,611 A * 7/1998 Thantrakul ..................... 713/1

FOREIGN PATENT DOCUMENTS

| JP | 8-249016 | 9/1996 |
| JP | 9-231065 | 9/1997 |
| JP | 11-282590 | 10/1999 |
| JP | 2002-132527 | 5/2002 |

* cited by examiner

*Primary Examiner*—Matthew Kim
*Assistant Examiner*—Paul Schlie
(74) *Attorney, Agent, or Firm*—Staas & Halsey LLP

(57) ABSTRACT

An internal nonvolatile memory contains a program to be executed during a rewrite operation mode. During the rewrite operation mode a CPU core writes received rewrite data to an external nonvolatile memory according to a program in the internal nonvolatile memory. A first selector circuit transmits a first chip select signal to the external nonvolatile memory when a mode signal indicates a normal operation mode, and transmits the first chip select signal to the internal nonvolatile memory when the mode signal indicates the rewrite operation mode. Since the activation of the internal nonvolatile memory is inhibited during the normal operation mode, it is possible to prevent erroneous execution of the program in the internal nonvolatile memory during the normal operation mode, and to prevent data rewrite to the external nonvolatile memory.

7 Claims, 4 Drawing Sheets

MICROCONTROLLER

CROSS REFERENCE TO RELATED APPLICATION

This application is based upon and claims the benefit of priority from Japanese Patent Application No. 2003-186518, filed on Jun. 30, 2003, the entire contents of which are incorporated herein by reference.

BACKGROUND OF THE INVENTION

1. Field of the Invention

The present invention relates to a technique for facilitating rewriting of data in a flash memory or other electrically rewritable external nonvolatile memory which is connected with a microcontroller.

2. Description of the Related Art

Data in an external nonvolatile memory such as a flash memory mounted on a system board is rewritten by detaching the external nonvolatile memory from the system board and attaching the detached external nonvolatile memory to a dedicated rewriting apparatus such as a flash writer. The external nonvolatile memory is mounted on the system board via an IC socket so that it can be detached from the system board easily at the time of data rewrite. The system board thus increases in area because of the IC socket mounted thereon, which also increases the system cost.

To solve such a problem, for example, Japanese Unexamined Patent Application Publication No. Hei 9-231065 has proposed a technique in which an external nonvolatile memory contains in advance a rewrite program for rewriting data of this external nonvolatile memory, and the rewrite program is copied to a volatile memory at the time of data rewrite. In this technique, executing the rewrite program on the volatile memory enables data rewrite without the detachment of the external nonvolatile memory from the system board.

Japanese Unexamined Patent Application Publication No. Hei 8-249016, for example, has also proposed a technique in which a microprocessor implements thereon a CPU core and an internal nonvolatile memory containing the foregoing rewrite program, and the CPU core's execution of the rewrite program on the internal nonvolatile memory realizes data rewrite without the detachment of the external nonvolatile memory from the system board.

SUMMARY OF THE INVENTION

It is an object of the present invention to prevent the occurrence of erroneous data rewrite to a flash memory or other electrically rewritable external nonvolatile memory connected to a microcontroller.

Another object of the present invention is to realize easy and reliable data rewrite to a flash memory or other electrically rewritable external nonvolatile memory connected to a microcontroller.

According to one of the aspects of the microcontroller of the present invention, a mode terminal receives a mode signal to distinguish a normal operation mode and a rewrite operation mode. An internal nonvolatile memory stores therein a program to be executed during the rewrite operation mode. A CPU core generates address signals sequentially, and activates a first chip select signal when the address signals designate a first area. Moreover, the CPU core receives rewrite data during the rewrite operation mode according to a program stored in the internal nonvolatile memory, and writes the received rewrite data to an electrically rewritable external nonvolatile memory connected to the microcontroller.

Upon receiving the mode signal at its select terminal, a first selector circuit transmits the first chip select signal to the external nonvolatile memory when the mode signal indicates the normal operation mode, and transmits the first chip select signal to the internal nonvolatile memory when the mode signal indicates the rewrite operation mode. Since the destination to which the first chip select signal is supplied is changed according to the operation mode, the internal nonvolatile memory will not be activated by the first chip select signal during the normal operation mode. It is therefore possible to prevent erroneous execution of the program in the internal nonvolatile memory during the normal operation mode, and to prevent data rewrite to the external nonvolatile memory.

According to another aspect of the microcontroller of the present invention, the microcontroller includes an internal volatile memory to be accessed by the CPU core. The internal nonvolatile memory stores in advance therein a transfer program for transferring the rewrite data to be written to the external nonvolatile memory to the internal volatile memory and a rewrite program for writing the rewrite data to the external nonvolatile memory. During the rewrite operation mode, the CPU core executes the transfer program to receive the rewrite data and executes the rewrite program to write the received rewrite data to the external nonvolatile memory. Since the transfer program and the rewrite program are stored in the internal nonvolatile memory in advance, the data in the external nonvolatile memory is rewrittable easily and quickly after the normal operation mode shifts to the rewrite operation mode.

According to another aspect of the microcontroller of the present invention, the microcontroller includes an internal volatile memory to be accessed by the CPU core. The internal nonvolatile memory stores in advance therein a transfer program for transferring to the internal volatile memory the rewrite data and a rewrite program for writing the rewrite data to the external nonvolatile memory. The CPU core executes the transfer program to transfer the rewrite data and the rewrite program to the internal volatile memory, and executes the transferred rewrite program to write the transferred rewrite data to the external nonvolatile memory. Since the rewrite program need not be stored in the internal nonvolatile memory in advance, the internal nonvolatile memory can be reduced in memory capacity. As a result, the microcontroller can be reduced in chip size with a reduction in chip cost.

According to another aspect of the microcontroller of the present invention, the CPU core outputs a mode switch signal upon completing writing of the rewrite data to the external nonvolatile memory. When receiving the mode switch signal, a selector control circuit disables the mode signal input via the mode terminal and forcibly outputs a level indicating the normal operation mode to the select terminal of the first selector circuit. This enables the mode shift from the rewrite operation mode to the normal operation mode after the writing of the rewrite data, independent of the mode signal from exterior of the microcontroller. The microcontroller is able to return to the normal operation mode under the CPU core's control so that new written data in the external nonvolatile memory become accessible without resetting the CPU core.

According to another aspect of the microcontroller of the present invention, the microcontroller includes first and second selector circuits. The CPU core activates a second chip select signal when the address signals designate a second area. The second selector circuit receives the mode signal at its select terminal, and transmits the second chip select signal to an external volatile memory connected to the microcontroller when the mode signal indicates the normal operation mode. The second selector circuit transmits the second chip select signal to the external nonvolatile memory when the mode signal indicates the rewrite operation mode. In other words, during the normal operation mode, the external nonvolatile memory and the external volatile memory become accessible by the first and second chip select signals, respectively. During the rewrite operation mode, the internal nonvolatile memory and the external nonvolatile memory become accessible by the first and second chip select signals, respectively.

The CPU core can directly access the external nonvolatile memory with the second chip select signal during the rewrite operation mode. Consequently, the rewrite data can be written to the external nonvolatile memory easily by simply switching the first and second selector circuits.

According to another aspect of the microcontroller of the present invention, the CPU core outputs a mode switch signal upon completing writing of the rewrite data to the external nonvolatile memory. When receiving the mode switch signal, a selector control circuit disables the mode signal input via the mode terminal and forcibly outputs a level indicating the normal operation mode to the select terminals of the first and second selector circuits. This enables the mode shift from the rewrite operation mode to the normal operation mode after the rewrite data is written, independent of the mode signal from exterior of the microcontroller. The microcontroller is able to return to the normal operation mode under the CPU core's control so that new written data in the external nonvolatile memory become accessible without resetting the CPU core.

According to another aspect of the microcontroller of the present invention, an interface circuit receives the rewrite data to be written to the external nonvolatile memory via an external terminal. The CPU core controls the interface circuit according to the program to receive the rewrite data. The formation of the interface circuit allows the microcontroller to receive rewrite data of various forms or voltage levels. For example, an interface circuit having a serial/parallel conversion function can be used to convert serial data supplied through the external terminal into parallel data corresponding to the data bus width of the CPU core. It is also possible to convert rewrite data input at TTL level into that of CMOS level.

According to another aspect of the microcontroller of the present invention, the microcontroller includes an internal volatile memory to be accessed by the CPU core. The CPU core transfers the rewrite data to the internal volatile memory through the interface circuit during the rewrite operation mode. Temporarily storing the rewrite data is in the internal volatile memory makes it possible to write the rewrite data to the external nonvolatile memory with reliability, regardless of the reception rate of the rewrite data. In other words, it is possible to preclude the rewrite data from being lost.

According to another aspect of the microcontroller of the present invention, the CPU core generates an address signal which designates the first area initially at the time of the power-on. Consequently, during the rewrite operation mode, the rewrite data is written to the external nonvolatile memory immediately after the powered-on microcontroller is reset. Since the rewrite data can always be written to the external nonvolatile memory in a same state (that the microcontroller is reset), it is possible to avoid malfunction of the micro controller.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
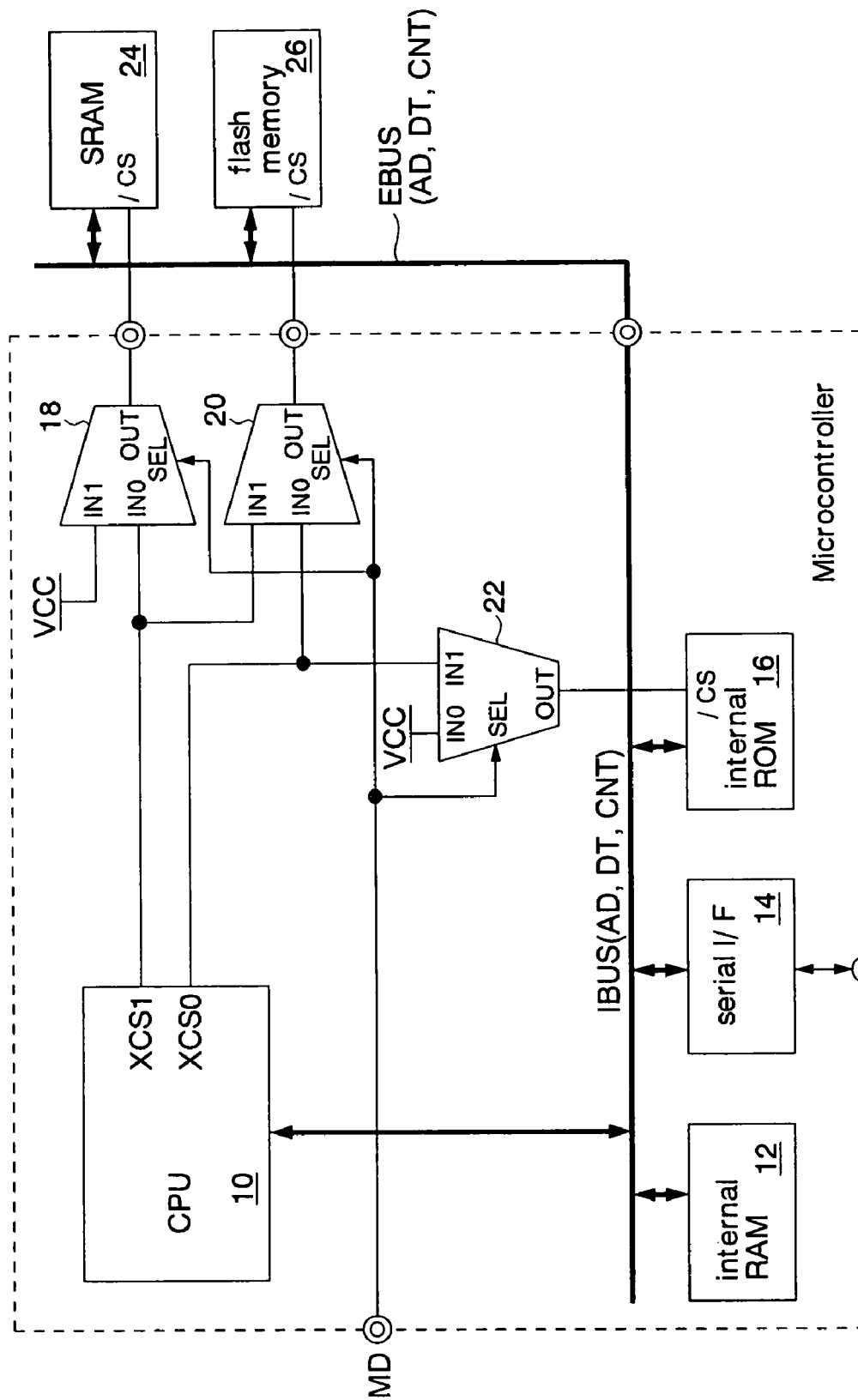
FIG. 1 is a block diagram showing a first embodiment of the microcontroller of the present invention.

The present invention will solve the following problems.

With the rewrite program stored in the external nonvolatile memory in advance, the memory capacity thereof available to users decreases. The use of an external nonvolatile memory of greater memory capacity for securing the users' memory area increases the system cost.

When the internal nonvolatile memory in the microprocessor contains the rewrite program, the CPU core can access the rewrite program at any time. As a result, if the rewrite program is executed erroneously by noise, a software bug, or the like, the data in the nonvolatile memory may be rewritten with erroneous data. In this case, the system goes down.

Hereinafter, embodiments of the present invention will be described with reference to the drawings. In the drawings, each thick line represents a signal line that consists of a plurality of lines. Terminals with a leading "/" are of negative logic.

FIG. 1 shows a first embodiment of the microcontroller of the present invention. This microcontroller is formed as a single-chip microcomputer on a silicon substrate by using CMOS processes.

The microcontroller has a CPU core 10, an internal RAM 12 (internal volatile memory), a serial interface circuit 14, an internal ROM 16 (internal nonvolatile memory), and selectors 18, 20, and 22. The double circles on the dashed frame which represents the microcontroller represent external terminals. The internal RAM 12, the serial interface circuit 14, and the internal ROM 16 are connected with the CPU core 10 via an internal bus IBUS.

The CPU core 10 outputs a chip select signal XCS0 (first chip select signal) and a chip select signal XCS1 (second chip select signal). The chip select signals XCS0 and XCS1 are signals of negative logic, being enabled and activated when they are "logic 0". The chip select signals XCS0 and XCS1 are activated when an address signal AD generated inside the CPU core 10 designates a first area and a second area, respectively. For example, the CPU core 10 is preset so that the first area corresponds to address signals AD of "00000"-"3FFFF" in hexadecimal, and the second area corresponds to address signals AD of "40000"-"7FFFF". The CPU core 10 when powered on generates the address signals AD sequentially starting from an address signal AD=00000". That is, at the beginning of power-on, the chip select signal XCS0 is activated to fetch data (program) in the first area.

The internal RAM 12 is used as a work memory, and is also used to temporarily store rewrite data that is input through the serial interface circuit 14 as will be described later. The rewrite data is a user program (product program) to be stored in a flash memory 26. The internal RAM 12 is accessed through the internal bus IBUS according to another, not-shown chip select signal output from the CPU core 10. Since the rewrite data is temporarily stored in the internal RAM 12, it is possible to write the rewrite data to the flash memory 26 (external nonvolatile memory) with reliability, for example, regardless of the rate of reception of the rewrite data and without losing the rewrite data.

The serial interface circuit 14 converts serial data supplied from exterior through an external terminal I/O into parallel data, and outputs the same to the internal bus IBUS. For example, the serial interface circuit 14 converts an input of TTL level into CMOS level. The serial interface circuit 14 also converts parallel data transmitted to the internal bus IBUS into serial data, and outputs the same to the external terminal I/O.

The serial interface circuit 14 is allocated as a memory-mapped I/O, and operates according to a program executed by the CPU core 10. For example, the serial interface circuit 14 is a USB (Universal Serial Bus) controller or UART (Universal Asynchronous Receiver-Transmitter). In this embodiment, the serial interface circuit 14 receives the rewrite data to be written to the flash memory 26 through the external terminal I/O during a rewrite operation mode.

The internal ROM 16 contains in advance a transfer program for transferring the user program to be written to the flash memory 26 during the rewrite operation mode to the internal RAM 12 through the serial interface circuit 14, and a rewrite program for writing the user program to the flash memory 26. The internal ROM 16 is accessed by the CPU core 10 via the internal bus IBUS.

The internal bus IBUS is composed of an address bus for transmitting the address signal AD, a data bus for transmitting a data signal DT, and a control bus for transmitting a control signal CNT. The internal bus IBUS is connected to an external bus EBUS through an external terminal. The external bus EBUS is connected with an SRAM chip 24 (external volatile memory) and the flash memory chip 26 which are mounted on a system board along with the microcontroller.

The SRAM 24 is used as a work memory. The flash memory 26 contains programs for implementing product functions the CPU core 10 execute. Incidentally, if the internal bus IBUS and the external bus EBUS differ from each other in specifications (input voltage, output voltage, etc.), the internal bus IBUS and the external bus EBUS may be connected with each other via a bus interface circuit (not shown) for specification matching.

A mode terminal (mode signal) MD is set to low level during a normal operation mode (during execution of a user program). It is set to high level, by the system on which the microcontroller is mounted, during the rewrite operation mode for rewriting the user program in the flash memory 26. For example, the mode terminal MD is changed to high level by switching a DIP switch which is formed on the system board on which the microcontroller is mounted. Alternatively, the mode terminal MD is changed to high level by continuously pressing an operation switch of the product realized by the system board (such as a digital camera and a cellular phone) for a predetermined period of time.

The selectors 18, 20, and 22 are the same circuits, each of which outputs the signal supplied to an input terminal IN0 thereof to its output terminal OUT when the mode signal MD supplied to its select terminal SEL is at low level ("logic 0"), and outputs the signal supplied to an input terminal IN1 thereof to the output terminal OUT when the mode signal MD is at high level ("logic 1"). The selectors 20 and 22 operate as a first selector circuit for transmitting the chip select signal XCS0 to the flash memory 26 when the mode signal MD is at low level, and transmitting the chip select signal XCS0 to the internal ROM 16 when the mode signal MD is at high level. The selectors 18 and 20 operate as a second selector circuit for transmitting the chip select signal XCS1 to a chip select terminal/CS of the SRAM 24 when the mode signal MD is at low level, and transmitting the chip select signal XCS1 to a chip select terminal/CS of the flash memory 26 when the mode signal MD is at high level.

The selector 18 transmits the chip select signal XCS1 from the CPU core 10 to the chip select terminal/CS of the SRAM 24 when the mode signal MD is at low level, and transmits a supply voltage VCC (high level) to the chip select terminal/CS of the SRAM 24 when the mode signal MD is at high level. That is, the SRAM 24 is selected depending on the chip select signal XCS1 during the normal operation mode (mode signal MD=low level), and deselected during the rewrite operation mode (mode signal MD=high level).

The selector 20 transmits the chip select signal XCS0 to the chip select terminal/CS of the flash memory 26 when the mode signal MD is at low level, and transmits the chip select signal XCS1 to the chip select terminal/CS of the flash memory 26 when the mode signal MD is at high level. That is, the flash memory 26 is selected depending on the chip select signal XCS0 during the normal operation mode (mode signal MD=low level), and selected depending on the chip select signal XCS1 during the rewrite operation mode (mode signal MD=high level).

The selector 22 transmits the supply voltage (high level) to the chip select terminal/CS of the internal ROM 16 when the mode signal MD is at low level, and transmits the chip select signal XCS0 to the chip select terminal/CS of the internal ROM 16 when the mode signal MD is at high level. That is, the internal ROM 16 is deselected during the normal operation mode (mode signal MD=low level), and selected depending on the chip select signal XCS0 during the rewrite operation mode (mode signal MD=high level).

Figure 2:
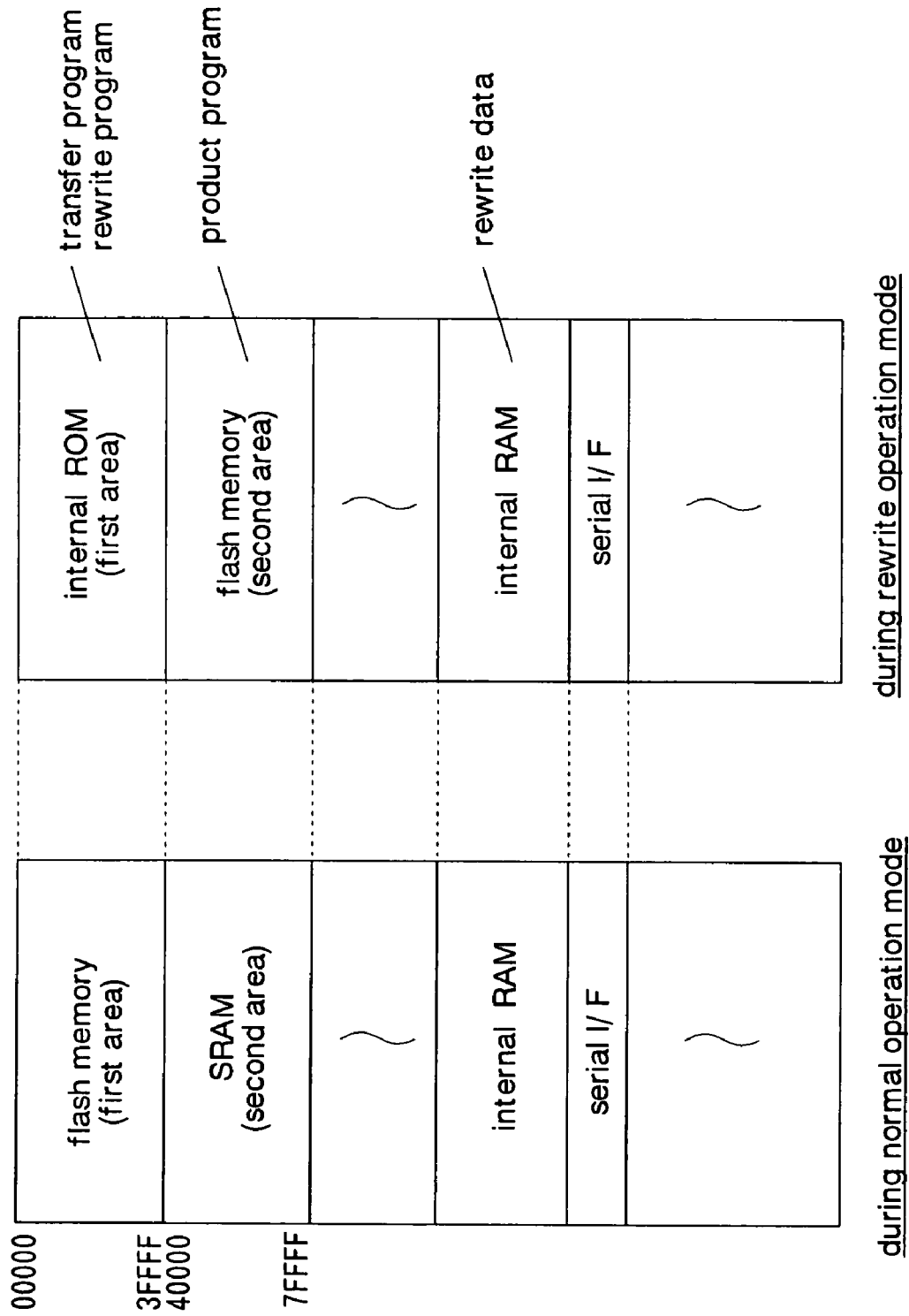
FIG. 2 is an explanatory diagram showing memory maps of the first embodiment.

FIG. 2 shows memory maps of the first embodiment during the normal operation mode and during the rewrite operation mode. The following description will also cover the operation during the normal operation mode and the operation during the rewrite operation mode.

During the normal operation mode, the mode signal MD is at low level. The selectors 18, 20, and 22 thus supply the chip select signals XCS0 and XCS1 to the flash memory 26 and the SRAM 24, respectively. Consequently, the first area is allocated to the flash memory 26 and the second area is allocated to the SRAM 24. Other areas are allocated to the internal RAM 12 and the serial interface circuit 14. When powered on, the CPU core 10 initially fetches the user program written in the flash memory 26.

The internal ROM 16 is inactivated by its chip select terminal/CS receiving high level from the selector 22. Since the internal ROM 16 does not exist on the memory map, it will not be accessed even by power noise or program bugs. That is, neither the transfer program nor the rewrite program in the flash memory 26 is performed during the normal operation mode.

When the mode signal MD changes to high level and the operation mode shifts from the normal operation mode to the rewrite operation mode, the selectors 18, 20, and 22 supply the chip select signals XCS0 and XCS1 to the internal ROM 16 and the flash memory 26, respectively. Consequently, the first area is allocated to the internal ROM 16 and the second area is allocated to the flash memory 26. The SRAM 24 is inactivated by its chip select terminal/CS receiving high level from the selector 18. Thus, the SRAM 24 does not exist on the memory map. As in the normal operation mode, other areas are allocated to the internal RAM 12 and the serial interface circuit 14. The system board on which the microcontroller is mounted supplies a reset signal to a reset terminal (not shown) of the CPU core 10 along with the change in the mode signal MD to high level. Consequently, the CPU core 10 after reset fetches the transfer program written in the internal ROM 16.

The transfer program executed by the CPU core 10 transfers the rewrite data of the flash memory 26 to the internal RAM 12 through the serial interface circuit 14. Subsequently, the CPU core 10 performs the rewrite program in the internal ROM 16 to write the rewrite data to the flash memory 26. More specifically, based on the rewrite program, a batch erase is conducted of the data in the entire area of the flash memory 26 before the rewrite data is written to the flash memory 26.

Executing the transfer program immediately after the power-on resetting of the microcontroller enables the microcontroller to be always in a same state, which allows writing of rewrite data to the flash memory 26. This can preclude malfunctions and miswrites thereof.

As described above, during the rewrite operation mode, the chip select signal XCS1 is supplied to the chip select terminal/CS of the flash memory 26 by the selector 20. That is, the switching operation of the selector 20 allows the flash memory 26 to exist on the memory map instead of the SRAM 24. Consequently, the CPU core 10 can program the flash memory 26 with the rewrite data easily.

After the completion of the data rewrite operation on the flash memory 26, the microcontroller or the system board is powered on again by an operator's operation (re-power on). During the power-on resetting of the system board, the mode signal MD is changed from high level to low level, so that the operation mode returns from the rewrite operation mode to the normal operation mode.

Then, the CPU core 10 starts to fetch newly written user program in the flash memory 26.

As has been described, according to the first embodiment, the selector 22 is switched to inhibit the internal ROM 16 from being activated by the chip select signal XCS0 during the normal operation mode. The transfer program and the rewrite program in the internal ROM 16 can thus be precluded from being erroneously executed during the normal operation mode, and it is possible to prevent the user program in the flash memory 26 from being rewritten.

Since the transfer program and the rewrite program are written to the internal ROM 16 in advance, the user program in the flash memory 26 can be rewritten easily and quickly after the normal operation mode shifts to the rewrite operation mode.

During the rewrite operation mode, the selector circuit 20 supplies the chip select signal XCS1 to the flash memory 26. The CPU core 10 can thus access the flash memory 26 directly during the rewrite operation mode. This facilitates writing of the user program to the flash memory 26.

Figure 3:
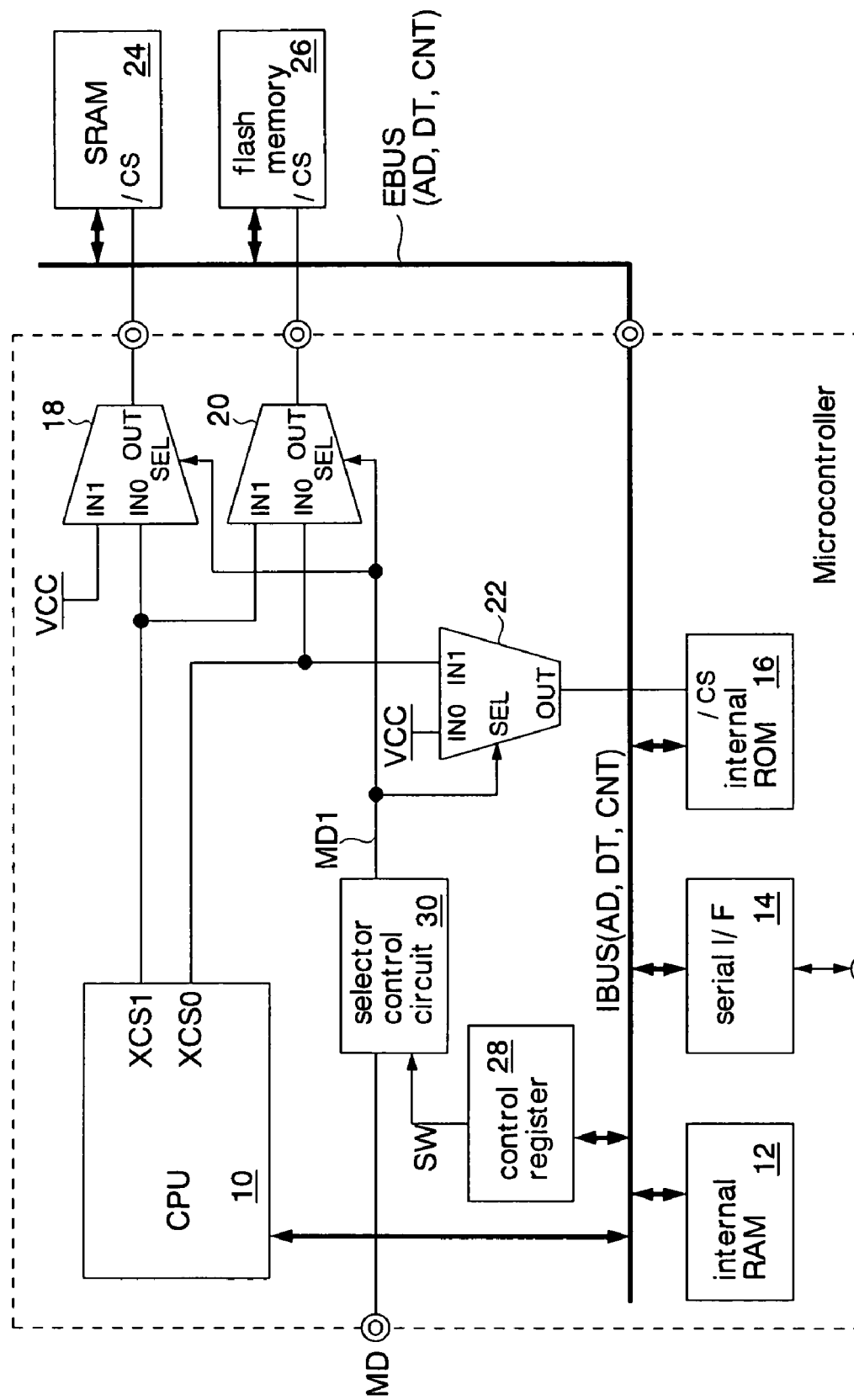
FIG. 3 is a block diagram showing a second embodiment of the microcontroller of the present invention.

FIG. 3 shows a second embodiment of the semiconductor memory of the present invention. The same elements as those described in the first embodiment will be designated by identical reference numbers or symbols. Detailed description thereof will be omitted here.

In this embodiment, the microcontroller has a control register 28 and a selector control circuit 30 aside from the components of the first embodiment. The rest of the configuration is the same as in the first embodiment.

The control register 28 is allocated as a memory-mapped I/O, and is selected by a predetermined address signal AD. The CPU core 10 writes high level ("logic 1") to the control register 28 in response to the completion of writing of the rewrite data to the flash memory 26 during the rewrite operation mode. To write the high level the CPU core 10 outputs the data signal DT as a mode switch signal to the control register 28. In synchronization with the writing of high level by the CPU core 10, the control register 28 outputs a mode switch signal SW (high level) to the selector control circuit 30.

In response to the mode switch signal SW of high level, the selector control circuit 30 inhibits the supply of the mode signal MD input through the mode terminal MD to the selectors 18, 20, and 22 as the mode signal MD1, and forcibly changes the mode signal MD1 from high level to low level. That is, in response to the mode switch signal SW, the selector control circuit 30 disables the mode signal MD and changes the operation mode from the rewrite operation mode to the normal operation mode. Consequently, after writing the rewrite data, the CPU core 10 without being reset can execute the new user program.

Figure 4:
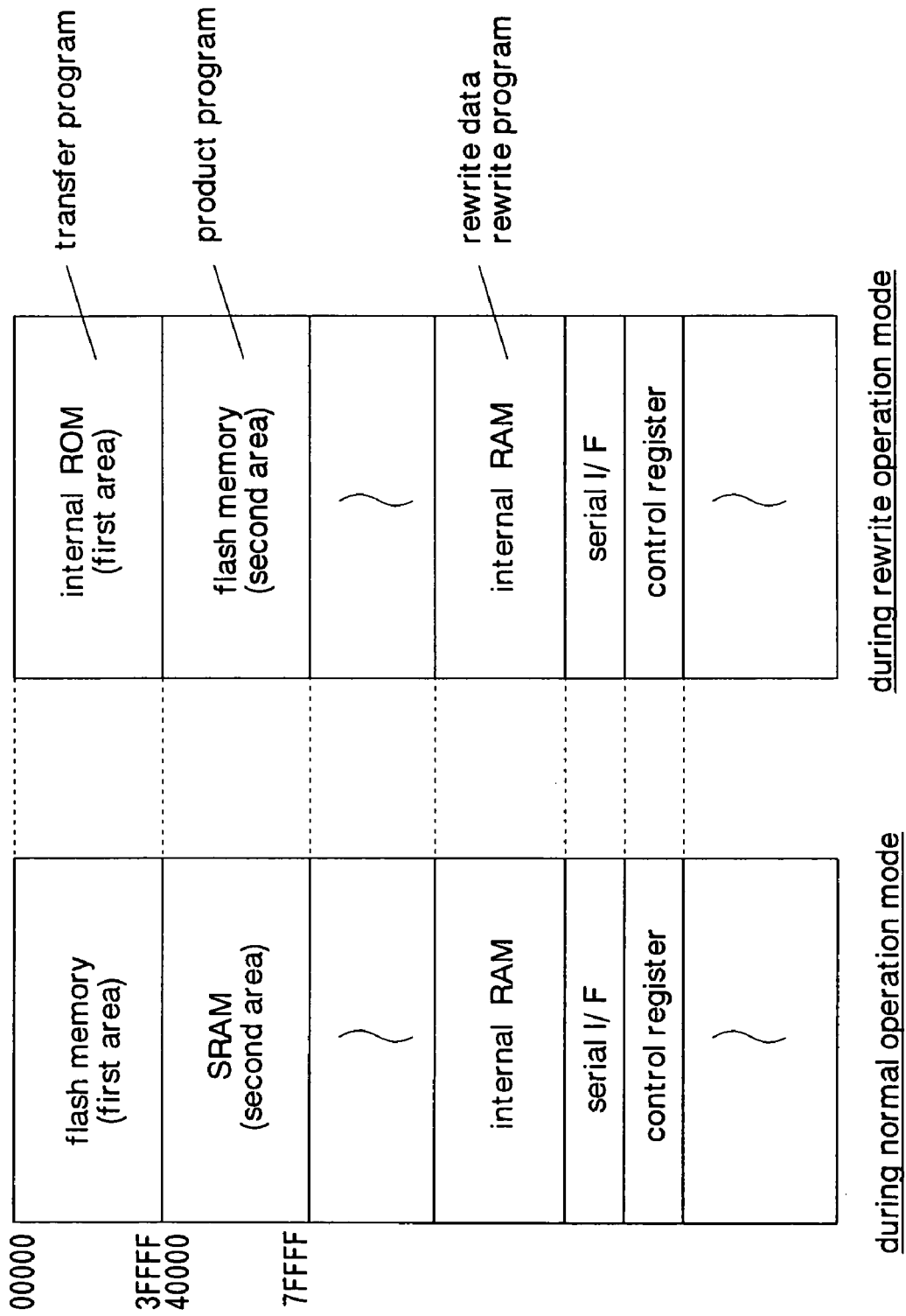
FIG. 4 is an explanatory diagram showing memory maps of the second embodiment.

FIG. 4 shows memory maps of the second embodiment during the normal operation mode and during the rewrite operation mode. The memory maps are the same as in the first embodiment except that a new area is added for the control register 28. Note that the data stored in the internal ROM 16 and in the internal RAM 12 is different from in the first embodiment. The following description will also cover the operation during the rewrite operation mode. The operation during the normal operation mode is the same as in the first embodiment, and thus omitted from the description.

When the mode signal MD changes to high level and the operation mode shifts from the normal operation mode to the rewrite operation mode, the first area is allocated to the internal ROM 16 and the second area is allocated to the flash memory 26. The SRAM 24 is inactivated by its chip select terminal/CS receiving high level from the selector 18. As in the first embodiment, the CPU core 10 fetches the transfer program written in the internal ROM 16 initially after a reset, in response to the reset signal supplied from the system board.

The transfer program executed by the CPU core 10 transfers the rewrite data of the flash memory 26 and the rewrite program for writing this rewrite data to the flash memory 26 to the internal RAM 12 through the serial interface circuit 14. Inputting the rewrite program from exterior of the microcontroller allows a reduction in the memory capacity of the internal ROM 16. This also facilitates updating the rewrite program. Subsequently, the CPU core 10 executes the rewrite program in the internal RAM 12 to write the rewrite data to the flash memory 26.

After the completion of the data rewrite operation on the flash memory 26, the CPU core 10 writes high level to the control register 28. The selector control circuit 30 receives the switch signal SW from the control register 28, and changes the mode signal MD1 from high level to low level. Due to the change in the mode signal MD1, the operation mode shifts from the rewrite operation mode to the normal operation mode, so that the first and second areas of the address map are allocated to the flash memory 26 and the SRAM 24.

Immediately after the writing to the control register 28, the CPU core 10 jumps to an address AD="00000". Then, the CPU core 10 starts to fetch the new user program in the flash memory 26 without power-on resetting.

This embodiment can provide the same effects as those of the first embodiment described above. Besides, in this embodiment, the rewrite data and the rewrite program for writing this rewrite data to the flash memory 26 are transferred from exterior of the microcontroller to the internal RAM 12 during the rewrite operation mode. Thus, the internal ROM 16 need not contain the rewrite program. This makes it possible to reduce the memory capacity of the internal ROM 16, reduce the chip size of the microcontroller, and reduce the chip cost.

In response to the completion of writing of the user program to the flash memory 26, the CPU core 10 changes the mode signal MD1 to be supplied to the selectors 18, 20, and 22 to low level forcibly regardless of the level supplied to the mode terminal MD. The CPU core 10 is able to control itself to return from the rewrite operation mode to the normal operation mode. It is therefore possible to execute the new user program in the flash memory 26 immediately after the rewriting thereof, without resetting the CPU core 10.

Incidentally, the foregoing first embodiment has dealt with the case where the rewrite data supplied through the serial interface circuit 14 is temporarily stored into the internal RAM 12. However, the present invention is not limited to such an embodiment. For example, the rewrite data may be stored in the SRAM 24 (external volatile memory) temporarily.

The foregoing embodiments have dealt with the cases where the present invention is applied to data rewrite to the flash memory 26. However, the present invention is not limited to such embodiments. For example, the present invention may be applied to rewriting of data in other electrically rewritable nonvolatile memories such as an EEPROM.

The foregoing embodiments have dealt with the case of writing a user program to the flash memory 26. However, the present invention is not limited to such embodiments. For example, not only the user program but also data to be used in the user program may be written to the flash memory 26.

The foregoing embodiments have dealt with the cases where the rewrite data is received by use of the serial interface circuit 14 such as a USB controller and a UART. However, the present invention is not limited to such embodiments. For example, a parallel data interface circuit may be used. The interface circuit is not limited to electric interfaces but may be optical interfaces.

The invention is not limited to the above embodiments and various modifications may be made without departing from the spirit and scope of the invention. Any improvement may be made in part or all of the components.

What is claimed is:

1. A microcontroller, comprising:
   a mode terminal receiving a mode signal to distinguish a normal operation mode and a rewrite operation mode;
   an internal nonvolatile memory storing therein a program to be executed during said rewrite operation mode;
   a CPU core generating address signals sequentially, activating a first chip select signal when the address signals designate a first area, activating a second chip select signal when the address signals designate a second area, receiving, during said rewrite operation mode, rewrite data according to the program stored in said internal nonvolatile memory, and writing the received rewrite data to an electrically rewritable internal volatile memory connected to the microcontroller;
   a selector circuit receiving the mode signal at a select terminal thereof, transmitting the first chip select signal to an external nonvolatile memory and transmitting the second chip select signal to an external volatile memory connected to the microcontroller when the mode signal indicates said normal operation mode, and receiving the mode signal at a select terminal thereof, transmitting a first chip select signal to an internal nonvolatile memory and transmitting the second chip select signal to said external nonvolatile memory when the mode signal indicates said rewrite operation mode.

2. The microcontroller according to claim 1, wherein:
   said internal volatile memory stores in advance therein a transfer program for transferring to said internal volatile memory the rewrite data to be written to said external nonvolatile memory and a rewrite program for writing the rewrite data to said external nonvolatile memory; and
   during said rewrite operation mode, said CPU core transfers the rewrite data to said internal volatile memory by executing said transfer program, and writes the transferred rewrite data to said external nonvolatile memory by executing said rewrite program.

3. The microcontroller according to claim 1, wherein:
   said internal volatile memory stores in advance therein a transfer program for transferring, to said internal volatile memory, the rewrite data to be written to said external nonvolatile memory and a rewrite program for writing the rewrite data to said external nonvolatile memory; and
   said CPU core transfers the rewrite data and said rewrite program to said internal volatile memory by executing said transfer program, and writes the rewrite data, transferred to said internal volatile memory, to said external nonvolatile memory by executing the rewrite program transferred to said internal volatile memory.

4. The microcontroller according to claim 1, further comprising:
   a selector control circuit forcibly outputting, to said selector circuit, a level indicating said normal operation mode, based on a control signal from the CPU core.

5. The microcontroller according to claim 1, further comprising:
   an interface circuit receiving the rewrite data to be written to said external nonvolatile memory via an external terminal; and said CPU core controlling said interface circuit according to said program to receive the rewrite data.

6. The microcontroller according to claim 5, further comprising:
   an internal volatile memory accessed by said CPU core; and said CPU core transferring the rewrite data to said internal volatile memory via said interface circuit during said rewrite operation mode.

7. The microcontroller according to claim 1, wherein:
   said CPU core generates an address signal which designates a first area initially after power-on.

* * * * *